United States Patent
Kabir et al.

(10) Patent No.: US 12,159,845 B2
(45) Date of Patent: Dec. 3, 2024

(54) TRANSISTOR WITH INTEGRATED PASSIVE COMPONENTS

(71) Applicant: NXP USA, Inc., Austin, TX (US)

(72) Inventors: Humayun Kabir, Gilbert, AZ (US);
Vikas Shilimkar, Chandler, AZ (US);
Ibrahim Khalil, Gilbert, AZ (US);
Kevin Kim, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 472 days.

(21) Appl. No.: 17/673,636

(22) Filed: Feb. 16, 2022

(65) Prior Publication Data

US 2023/0260935 A1   Aug. 17, 2023

(51) Int. Cl.
*H01L 23/58* (2006.01)
*H01L 23/00* (2006.01)
(Continued)

(52) U.S. Cl.
CPC .......... *H01L 23/66* (2013.01); *H01L 23/481* (2013.01); *H01L 24/05* (2013.01); *H01L 29/0696* (2013.01); *H01L 2223/6611* (2013.01); *H01L 2223/6616* (2013.01); *H01L 2223/6655* (2013.01); *H01L 2223/6672* (2013.01); *H01L 2224/05013* (2013.01);
(Continued)

(58) Field of Classification Search
CPC ....... H01L 23/66; H01L 23/481; H01L 24/05; H01L 29/0696; H01L 2223/6611; H01L 2223/6616; H01L 2223/6655; H01L 2223/6672; H01L 2224/05013; H01L 2224/05023; H01L 2224/05073; H01L 2924/1421; H01L 23/4824; H01L 23/5223; H01L 23/5227; H01L 2223/6627; H01L 2223/665
See application file for complete search history.

(56) References Cited

U.S. PATENT DOCUMENTS 8,048,766 B2  11/2011  Joly et al.
9,673,186 B2   6/2017  Takatani et al.
(Continued)

OTHER PUBLICATIONS

B. Geller, A. Hanson, A. Chaudhuri, A. Edwards and I. C. Kizilyalli, "A broadband low cost GaN-on-silicon MMIC amplifier," 2008 IEEE Radio Frequency Integrated Circuits Symposium, Atlanta, GA, USA, 2008, pp. 527-530.
(Continued)

*Primary Examiner* — Samuel Park

(57) ABSTRACT

A device includes a semiconductor substrate, a source metallization over an active area of the semiconductor substrate, a through-substrate via electrically connected to the source metallization, and an input bond pad formed in the semiconductor substrate and spaced apart from the active area. The input bond pad is electrically connected to a set of gate structures. The device includes a first inductive coil over the semiconductor substrate between a first portion of the source metallization and a second portion of the source metallization and a first capacitor over the semiconductor substrate between the first portion of the source metallization and the second portion of the source metallization. The first inductive coil and the first capacitor are connected in series between the input bond pad and the through-substrate via.

20 Claims, 6 Drawing Sheets

(51) Int. Cl.
 *H01L 23/48* (2006.01)
 *H01L 23/66* (2006.01)
 *H01L 29/06* (2006.01)
(52) U.S. Cl.
 CPC ............... *H01L 2224/05023* (2013.01); *H01L 2224/05073* (2013.01); *H01L 2924/1421* (2013.01)

(56) References Cited

U.S. PATENT DOCUMENTS

| | | | |
|---|---|---|---|
| 10,062,683 B1 | 8/2018 | Yang et al. | |
| 2007/0024374 A1* | 2/2007 | Blair | H01L 24/49 330/302 |
| 2016/0344353 A1* | 11/2016 | Watts | H05K 1/111 |
| 2019/0356284 A1* | 11/2019 | Zhu | H03F 3/245 |
| 2020/0091061 A1* | 3/2020 | Kobayashi | H02M 3/158 |
| 2020/0204119 A1* | 6/2020 | Roberts | H03F 3/195 |
| 2020/0295727 A1* | 9/2020 | Marek | H03H 7/01 |
| 2021/0408978 A1* | 12/2021 | Chidurala | H03F 1/56 |

OTHER PUBLICATIONS

D. Kim, J. M. Yook, S. J. An, S. R. Kim, J. Yook and J. C. Kim, "A compact and low-profile GaN power amplifier using interposer-based MMIC technology," 2014 IEEE 16th Electronics Packaging Technology Conference (EPTC), Singapore, 2014, pp. 672-675.

* cited by examiner

TRANSISTOR WITH INTEGRATED PASSIVE COMPONENTS

TECHNICAL FIELD OF THE INVENTION

The present invention relates generally to transistors. More specifically, the present invention relates to a transistor layout that incorporates passive components onto the substrate of a transistor device, where the passive components may form parts of matching networks and/or harmonic termination circuits.

BACKGROUND OF THE INVENTION

As part of an amplifier system, radio frequency (RF) power transistors are often connected to input and output matching networks and harmonic termination circuits to achieve desired performance. Typically, these networks and termination circuits are implemented using integrated passive devices that are discrete components external to the power transistors themselves. These discrete integrated passive devices can increase the overall footprint of the amplifier system and require additional manufacturing steps to deposit the discrete components and form the wirebond arrays that interconnect the components of the matching networks, termination circuits and the transistor itself.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

Figure 1:
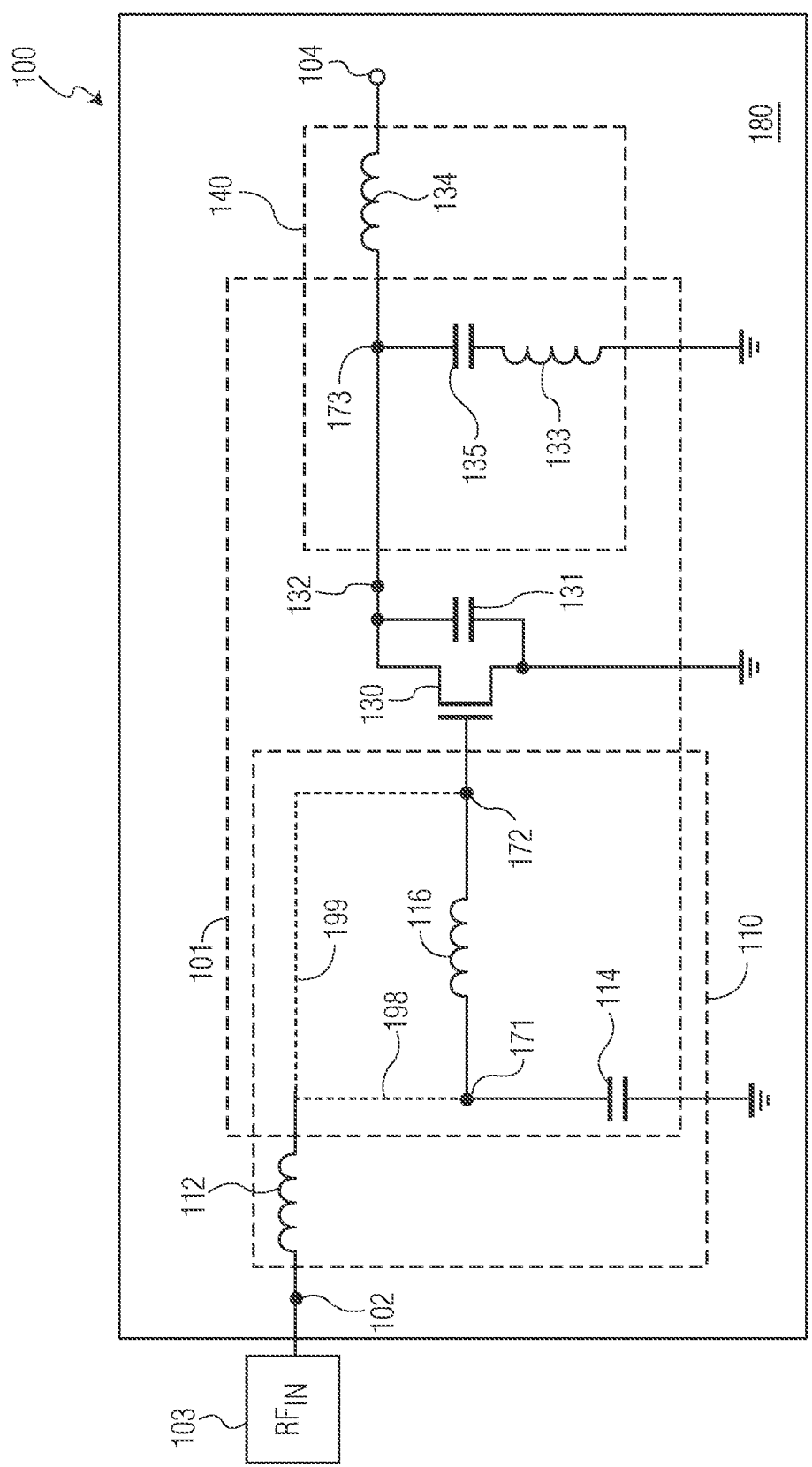
FIG. 1 shows a schematic of a common source field effect transistor circuit.

A radio frequency (RF) power transistor includes a semiconductor die with a plurality of interdigitated, elongated source and drain contacts. The source contacts are metal structures formed on a first surface of the semiconductor die's substrate. The source contacts form portions of source metallization structures that overlay a region or portion of the die's semiconductor substrate that can be referred to as a "source region." The drain contacts form portions of drain metallization structures and are formed on a second surface of the semiconductor substrate that opposes the first surface. The drain metallizations overlay another region or portion of the die's semiconductor substrate that can be referred to as a "drain region." The semiconductor die includes elongated channel regions located between adjacent source and drain regions. The source metallizations are electrically connected to a ground reference (e.g., a conductive layer on the back side of the transistor die) using through-substrate vias. The drain metallizations are contacted by elongated, conductive drain terminals, and an output end of each drain terminal is electrically connected to a drain bond pad (also referred to as an "output" bond pad herein), which extends perpendicularly to the drain terminals. The drain bond pad functions to combine the signals produced by and received from the drain terminals, and serves as the output terminal for the power transistor. An elongated gate structure overlies each channel region, and an RF signal applied to the gate structures varies the electrical conductivity of the channels, thus varying the amount of current flowing between sets of adjacent source and drain metallizations. An input end of each gate structure is connected to a gate bond pad (also referred to as an "input" bond pad herein), and the gate bond pad is configured to receive an input RF signal for amplification, and to convey that signal to the gate structures. During operation, an amplified version of the input RF signal is produced at the drain bond pad.

As discussed above, in typical RF amplifier systems, RF power transistors are packaged along with external integrated passive devices (IPDs) that can form part of the system's impedance matching networks (input and/or output) and harmonic termination circuits. These discrete components are separate from the RF power transistors and, consequently, increase the overall footprint of the amplifier system and add complexity to the manufacturing process due to the need for wirebond arrays to be installed for interconnecting the amplifier system's IPDs and RF transistors. In the present disclosure, a modified transistor layout is presented in which certain passive components (e.g., combinations of capacitors and/or inductors) are formed within the transistor structure itself. Specifically, inductive and capacitive passive components can be formed within the transistor's substrate in underutilized space between the transistor's source and drain regions. As described herein, these integrated passive components may form part or all of certain input and output impedance matching networks and/or harmonic termination circuits that are part of the amplifier system. By incorporating these passive components directly into the transistor structure, the overall footprint of the amplifier system can be reduced. Additionally, such amplifier system can require fewer wirebonds, which may simplify the manufacturing process and increase amplifier system reliability.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching may be utilized in the figures, the different elements within the structural layers may be formed out of the same material.

FIG. 1 is a schematic diagram of an RF power amplifier circuit 100. Circuit 100 includes a power amplifier device 101 (e.g., device 300, FIG. 3) with a plurality of components and circuitry that are connected to or contained within a power amplifier device package (i.e., the components and circuitry are "in-package" or at the "device plane"). More specifically, the power amplifier device 101 can be a discretely packaged circuit that includes an input 102 (e.g., a first conductive package lead) configured to receive an input signal RFin 103, an input circuit 110, a power transistor 130, an output circuit 140, and an output 104 (e.g., a second conductive package lead), in an embodiment. When incorporated into an amplifier system, the power amplifier device 101 may be mounted to a PCB 180 (or other type of system substrate, such as a conductive flange).

Input 102 and output 104 each may include a conductor, which is configured to enable the device 101 to be mechanically and electrically coupled with external circuitry, including conductive input and output connectors on the PCB 180. More specifically, the input 102 and the output 104 are physically positioned to span between the exterior and the interior of the device package, or to provide an electrical transition between the package plane and the device plane. Input circuit 110 is electrically coupled between the input 102 and a first terminal of transistor 130 (e.g., the gate terminal), and output circuit 140 is electrically coupled between a second terminal of transistor 130 (e.g., the drain terminal) and the output 104.

As described below, input circuit 110 may operate as either an impedance matching network or a harmonic termination circuit, depending upon the electrical interconnection between inductor 112 and the remainder of input circuit 110. If the connection is formed as depicted by dashed line 198 in FIG. 1 (in which inductor 112 is connected to node 171 and the connection indicated by dashed line 199 is not formed), input circuit 110 may operate as an impedance matching network. If, however, the connection is formed as depicted by the dashed line 199 in FIG. 1 (in which inductor 112 is connected to node 172 and the connection indicated by dashed line 198 is not formed), input circuit 110 may operate as a harmonic termination circuit on the input side of transistor 130.

According to an embodiment, transistor 130 is the primary active component of circuit 100. Transistor 130 includes a control terminal and two current conducting terminals, where the current conducting terminals are spatially and electrically separated by a variable-conductivity channel. For example, transistor 130 may be a field effect transistor (FET), which includes a gate (control terminal), a drain (a first current conducting terminal), and a source (a second current conducting terminal). According to an embodiment, and using nomenclature typically applied to FETs in a non-limiting manner, the gate of transistor 130 is coupled to the input circuit 110, the drain of transistor 130 is coupled to the output circuit 140, and the source of transistor 130 is coupled to ground (or another voltage reference). Through the variation of control signals provided to the gate of transistor 130, the current between the current conducting terminals of transistor 130 may be modulated.

According to various embodiments, transistor 130 can be a III-V field effect transistor (e.g., a high electron mobility transistor (HEMT)), which has a relatively low drain-source capacitance, Cds, when compared with a silicon-based FET (e.g., an LDMOS FET). In FIG. 1, the drain-source capacitance of transistor 130 is represented with capacitor 131 between the drain of transistor 130 and a transistor output terminal 132 (e.g., corresponding to transistor output bond pad 342, FIG. 3). More specifically, capacitor 131 is not a physical component, but instead models the drain-source capacitance of transistor 130. According to an embodiment, transistor 130 may have a drain-source capacitance that is less than about 0.1 pF/W or about 0.05 pF/W. Further, in some embodiments, transistor 130 may be a GaN FET, although in other embodiments, transistor 130 may be another type of III-V transistor (e.g., gallium arsenide (GaAs), gallium phosphide (GaP), indium phosphide (InP), or indium antimonide (InSb)), or another type of transistor that has a relatively low drain-source capacitance. In various embodiments, transistor 130 may include transistor-types having relatively low source-drain capacitance. Such transistors with relatively low-loss substrates may incorporate passive components in accordance with the present disclosure in which inductor quality factor (Q) is relatively high.

In embodiments in which the input signal RFin is supplied to node 171 via connection 198 (and connection 199 is not formed), the input circuit 110 operates as an input impedance matching circuit, with the input impedance matching circuit being coupled between the input 102 and the control terminal (e.g., gate) of the transistor 130.

When operating as an input impedance matching circuit, input circuit 110 is configured in a T-match configuration and includes the two inductive elements 112, 116 and a shunt capacitance 114. A first inductive element 112 (e.g., which may be implemented by a first wirebond or wirebond array) is coupled between input 102 and intermediate node 171, which is in turn coupled to a first terminal of capacitor 114. This connection is indicated by dashed line 198. In this configuration the connection represented by dashed line 199 is not formed and inductor 112 is not connected directly to node 172. A second inductive element 116 of the impedance matching circuit is coupled between the intermediate node 171 (and the first terminal of capacitor 114) and the control terminal of transistor 130. The second terminal of capacitor 114 is coupled to a ground reference node (or another voltage reference). As described herein, in embodiments of the present transistor layout structure, one or more of shunt capacitance 114 and inductive element 116 may be implemented by passive components formed within the internal structure of transistor 130.

According to an embodiment, the series combination of inductive elements 112, 116 may have an inductance value in a range between about 50 picohenries (pH) to about 3 nanohenries (nH), and shunt capacitance 114 may have a capacitance value in a range between about 5 picofarads (pF) to about 120 pF. In other embodiments, inductive elements 112 may have inductances that are at least partially determined by factors such as device applications, impedance matching and harmonic termination requirements, total size of the die embodying the inductive elements 112, frequency of transistor operation, and the like.

In other embodiments, input circuit 110 may operate as a harmonic termination circuit coupled between device input 102 and a ground node. In that case, the input signal RFin is supplied to node 172 rather than node 171 via the dashed line 199 connection between inductor 112 and node 172. In this configuration, the depicted electrical connection represented by dashed line 198 between inductor 112 and node 171 is not formed and inductor 112 is not directly connected to node 171 as is shown in FIG. 1. The harmonic termination circuit formed by input circuit 110 may be a second harmonic termination circuit, which is coupled between the device input 102 and ground (or another voltage reference).

In this configuration, the harmonic termination circuit formed by input circuit 110 includes inductive element 116 and capacitance 114 coupled in series between the node 172 (and the control terminal of transistor 130) and ground (or another voltage reference). This series-combination of elements functions as a low impedance path to ground for signal energy at a harmonic frequency (e.g., a second harmonic of a fundamental frequency of operation of circuit 100 or of an input signal to circuit 100). According to this embodiment, inductive element 116 may have an inductance value in a range between about 20 pH to about 2 nH, and capacitance 114 may have a capacitance value in a range between about 1 pF to about 100 pF, although these components may have values outside of these ranges, as well. For example, at a fundamental frequency of operation of 2.0 GHz, which has a second harmonic at 4.0 GHz, inductive element 116 may have an inductance value of about 140 pH, and capacitance 114 may have a capacitance value of about 11 pF.

In this configuration, the harmonic termination circuit provided by the series combination of inductor 116 and capacitor 114 is essentially equivalent to a capacitor at a fundamental frequency of operation of the circuit 100, with the capacitance value being approximately equivalent to the effective capacitance of the series-coupled inductance and capacitance (e.g., inductor 116 and capacitor 114, FIG. 1) of the harmonic termination circuit. In addition, the harmonic termination circuit may be used to control the second harmonic impedance across a wide fractional bandwidth at relatively low impedance (e.g., close to short circuit). This may be useful in achieving relatively high efficiency for broadband applications.

On the output side of transistor 130, output circuit 140 is coupled between the first current conducting terminal (e.g., drain) of transistor 130 and the output 104. Output circuit 140 can provide the functionality of a harmonic termination circuit that is coupled between the output terminal (e.g., drain) of the transistor 130 and output 104 and alternatively or in combination, output circuit 140 may also be configured to provide all or a portion of an impedance matching network between the drain terminal of transistor 130 and output 104.

The harmonic termination circuit formed by output circuit 140 includes capacitive element 135 and inductive element 133 coupled in series between node 173 and ground (or another voltage reference). This series-combination of elements functions as a low impedance path to ground for signal energy at a harmonic frequency (e.g., a second harmonic of a fundamental frequency of operation of circuit 100). According to this embodiment, inductive element 133 may have an inductance value in a range between about 20 pH to about 2 nH, and capacitance 135 may have a capacitance value in a range between about 1 pF to about 100 pF, although these components may have values outside of these ranges, as well. For example, at a fundamental frequency of operation of 2.0 GHz, which has a second harmonic at 4.0 GHz, inductive element 133 may have an inductance value of about 140 pH, and capacitance 135 may have a capacitance value of about 11 pF.

Although transistor 130 and various elements of the input and output circuits 110, 140, are shown as discrete components in FIG. 1, the depiction is for the purpose of ease of explanation only. Those of skill in the art would understand, based on the description herein, that transistor 130 and/or certain elements of the input and output circuits 110, 140 each may be implemented as multiple components (e.g., connected in parallel or in series with each other). Further, embodiments may include single-path amplifier devices (e.g., including a single input lead, output lead, transistor, etc.), dual-path amplifier devices (e.g., including two input leads, output leads, transistors, etc.), and/or multi-path amplifier devices (e.g., including two or more input leads, output leads, transistors, etc.). Further, the number of input/output leads may not be the same as the number of transistors (e.g., there may be multiple transistors operating in parallel for a given set of input/output leads). The description of transistor 130 and various elements of the input and output circuits 110, 140, above, thus are not intended to limit the scope of the inventive subject matter only to the illustrated embodiments.

As indicated above, the RF amplifier circuit 100 of FIG. 1 may be utilized as a single-path amplifier, which receives an RF signal 103 at input 102, amplifies the signal through transistor 130, and produces an amplified RF signal at output 104. Alternatively, multiple instances of the RF amplifier circuit 100 may be utilized to provide a multiple-path amplifier, such as a Doherty power amplifier or another type of multi-path amplifier circuit.

Figure 2A:
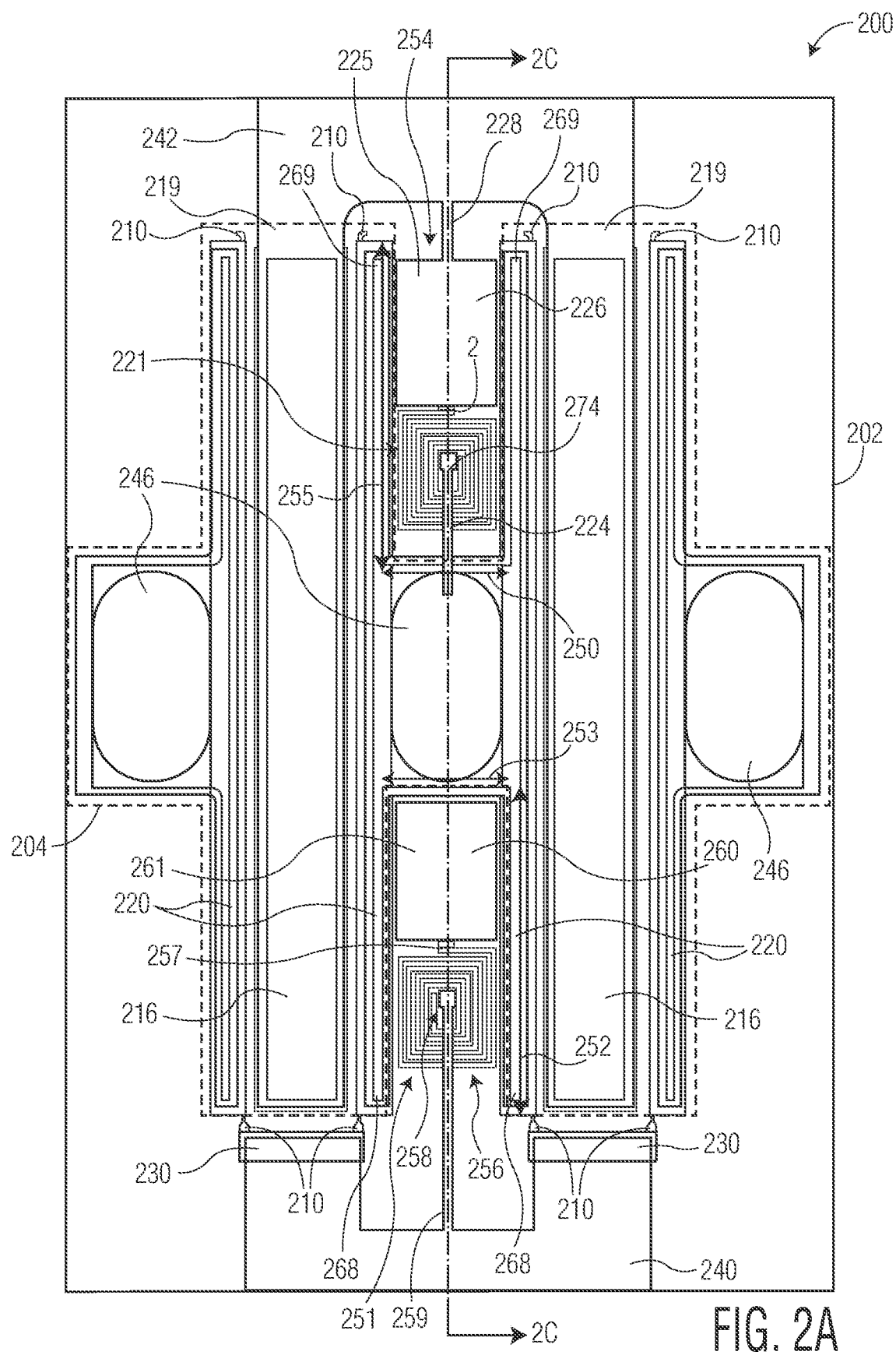
FIG. 2A shows a top view of a transistor cell in accordance with the present disclosure.
Figure 2B:
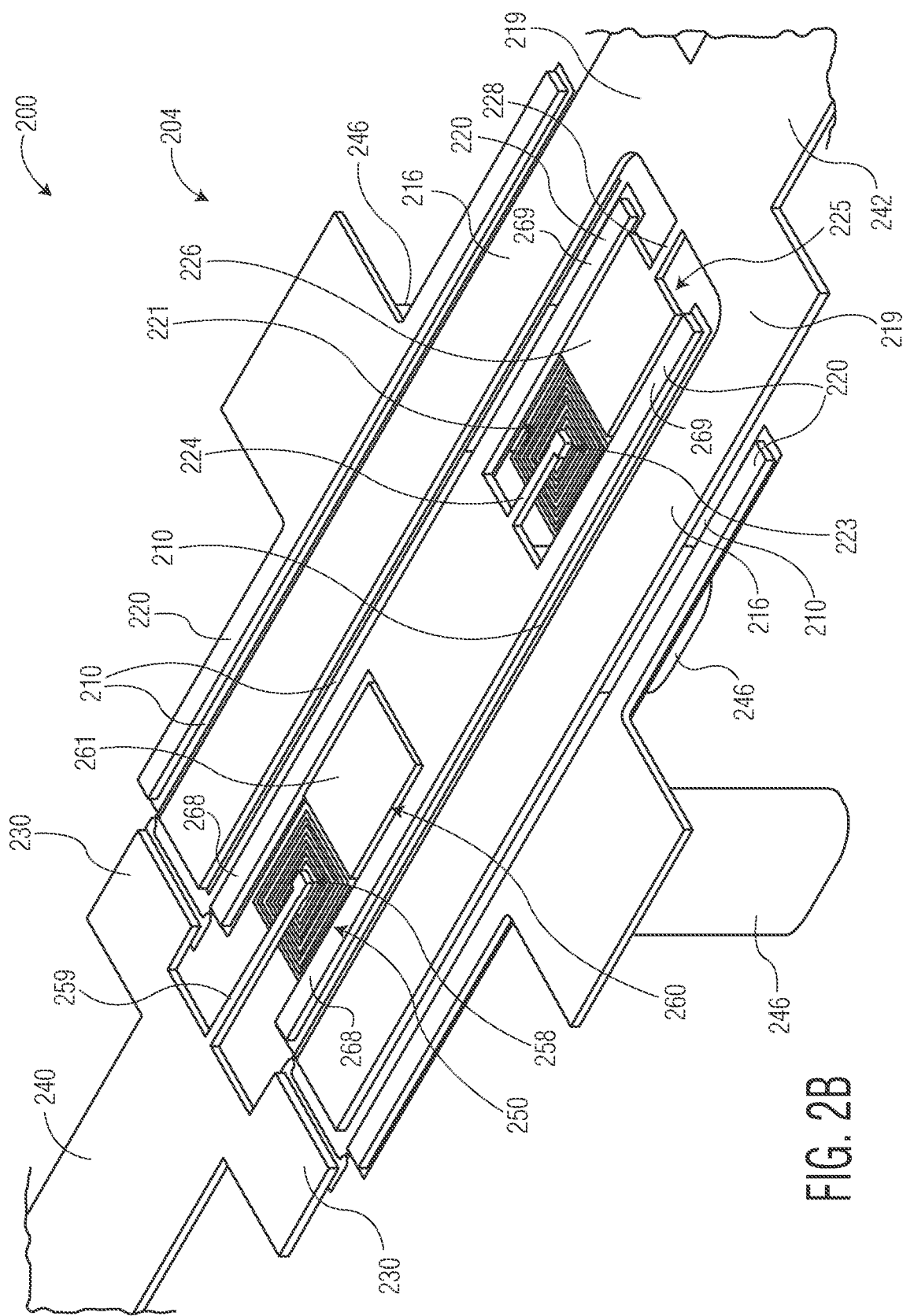
FIG. 2B shows a partial perspective view of the transistor cell of FIG. 2A and depicts more clearly the features associated with the passive components that are integrated into the transistor cell.
Figure 2C:
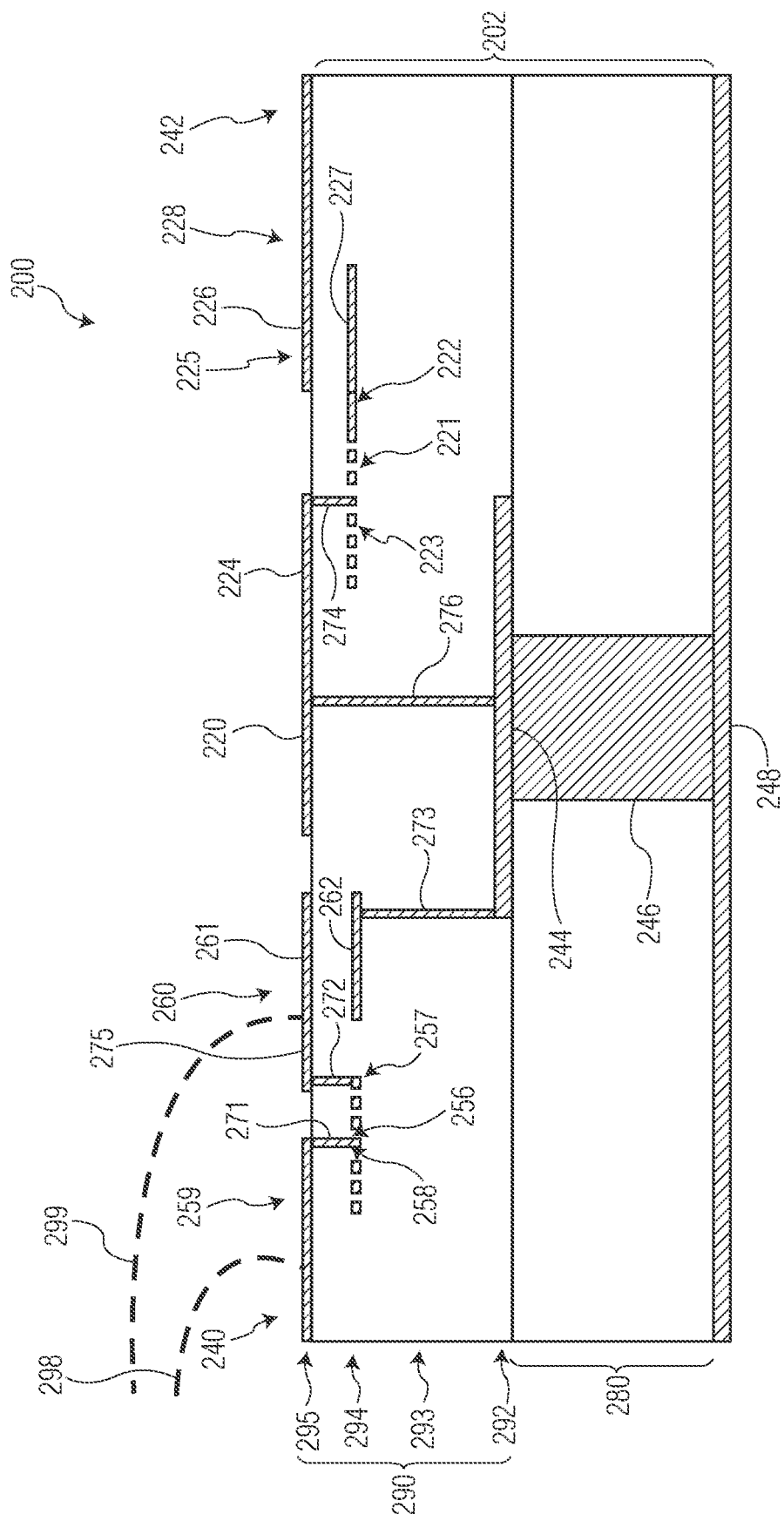
FIG. 2C is a cross-sectional view of the transistor cell of FIG. 2A taken through line 2C-2C.

Referring now to FIGS. 2A-2C, various views of a layout of a transistor cell 200 (e.g., a portion of transistor 130, FIG. 1) are shown, in accordance with an embodiment of the present invention. More specifically, FIG. 2A shows a top view of transistor cell 200, FIG. 2B shows a partial perspective view of transistor cell 200 that depicts more clearly the features associated with the passive components that are integrated into transistor cell 200, and FIG. 2C is a cross-sectional view of the transistor cell 200 of FIG. 2A through line 2C-2C.

Transistor cell 200 may employ a multi-layer circuit structure configured to be disposed within or formed partially over a semiconductor substrate 202. For reference, substrate 202 is not depicted in the simplified perspective view of FIG. 2B.

As best shown in the cross-section of FIG. 2C, substrate 202 includes a base semiconductor substrate 280 and a build-up structure 290 coupled to the top surface of the base semiconductor substrate 280. The base semiconductor substrate 280 may be formed, for example, from bulk or composite semiconductor materials (e.g., silicon (Si), gallium nitride (GaN), gallium arsenide (GaAs), silicon-on-insulator (SoI), GaN-on-insulator (e.g., GaN on Si, GaN on silicon carbide, GaN on sapphire, silicon germanium (SiGe), and so on), or other suitable materials). The build-up structure 290 includes multiple dielectric layers that separate multiple patterned conductive layers 292, 293, 294, 295, along with conductive vias (e.g., vias 271, 272, 273, 274) that electrically interconnect portions of the conductive layers 292-295. Although FIG. 2C illustrates a build-up structure 290 with four patterned conductive layers 292-295, other embodiments may include more or fewer conductive layers. In addition, although various features are illustrated within particular ones of the conductive layers 292-295, such features may be located in different layers (or combinations of other layers) than those depicted.

Transistor cell 200 includes an active area of active region 204 (see FIG. 2A) formed in substrate 202. Active region 204 includes sets of interdigitated input gate contacts 210 (four shown), output drain metallizations 216 (two shown), and common source metallizations 220 (four shown) disposed over substrate 202 and oriented substantially parallel to one another. In alternate embodiments, a transistor cell may include more or fewer gate structures, drain metallizations, and source metallizations. For example, in some embodiments, a transistor cell may include as few as two gate structures, one drain metallization, and two source metallizations (or two gate structures, two drain metallizations, and one source metallization, if the locations of the source and drain regions are switched).

Gate structures 210 are coupled to gate buses 230. A first bond pad, referred to herein as an input bond pad 240, is coupled to the gate buses 230 at an input side of active region 204. The input bond pad 240 is positioned outside of active region 204 at a first longitudinal end of the interdigitated set of gate structures 210, drain metallizations 216, and source metallizations 220.

A passive component in the form of inductor coil 256 is formed within build-up structure 290 over substrate 202 of transistor cell 200 between source metallizations 220 and between central TSV 246 and input bond pad 240. Specifically, inductor coil 256 is formed over the substrate 202 of transistor cell 200 within a notch 251 formed within the corresponding source metallization 220. Source metallization 220 may include a patterned metallization layer formed in the build-up structure over substrate 202 that may be electrically connected to one or more TSV 246. Specifically, the corresponding source metallization 220 has been patterned to include notch 251 allowing inductor coil 256 to be formed within build-up structure 290 over substrate 202 without contacting source metallizations 220. So patterned, source metallization 220 include a pair of source forks 268 that comprises extended portions of source metallization 220 that form the sides of notch 251. In embodiment, notch 251 may have a length 252 of about 400 micrometers (um) and a width 253 of about 47 micrometers. In other embodiments, however the geometry of notch 251 can be adjusted such that notch 251 is appropriately sized to enable an inductor (e.g., inductor coil 256), a capacitor (e.g., capacitor 260), and/or other passive components to be formed over substrate 202 where the passive components are not in contact with the corresponding source metallization 220. For example, in an embodiment, notch 251 may have a length 252 that ranges from 300 micrometers to 500 micrometers and a width 253 that ranges from 45 micrometers to 55 micrometers.

In an embodiment, inductor coil 256 is configured as a loop of conductive material that may be formed as part of one or more of the multiple patterned conductive layers 292, 293, 294, 295 of build-up structure 290. As shown in FIG. 2C, in the depicted embodiment, inductor coil 256 is formed horizontally within patterned metal layer 294 of build-up structure 290. It should be understood, however, that in other embodiment, inductor coil 256 may be formed within any of the patterned conductive layers 292, 293, 294, 295 present within build-up structure 290 and in any suitable shape or configuration to achieve desired inductive properties.

Additionally, although inductor coil 256 is depicted as being formed within a single patterned conductive layer, it should be understood that in other implementations parts or segments of inductor coil 256 could be formed in different ones of the patterned conductive layers 292, 293, 294, 295, in which case one or more vias may be utilized to interconnect the various parts or segments of the inductor coil 256.

Inductor coil 256 has a first terminal 257 that is on a perimeter of the inductor coil 256 structure and a second terminal 258 that is at the interior of the inductor coil 256. Second terminal 258 at the center inductor coil 256 is connected to input bond pad 240 by a conductive extension 259 and via 271. Extension 259 is formed in a patterned conductive layer (e.g., patterned conductive layer 295) of build-up structure 290.

Another passive component in the form of capacitor 260 is formed within build-up structure 290 between source metallizations 220 and between central TSV 246 and input bond pad 240. Specifically, capacitor 260 is formed within notch 251 defined in a patterned region of source metallizations 220 contact of transistor cell 200.

Capacitor 260 includes top plate 261 and bottom plate 262. In an embodiment, top plate 261 is formed in patterned conductive layer 295 of build-up structure and bottom plate 262 is formed in patterned conductive layer 292, though in other embodiments portions of different pattern conductive layers may be utilized to form the top and bottom plates of capacitor 260. Top plate 261 and bottom plate 262 are separated by one another by a portion of the dielectric layers making up build-up structure 290 to provide the dielectric of capacitor 260.

Top plate 261 of capacitor 260 is connected to terminal 257 of inductor coil 256 via conductive trace 275 (e.g., formed in patterned conductive layer 295) and conductive via 272 which is in electrically coupled to conductive trace 275 and terminal 257. Bottom plate 262 of capacitor 260 is connected to a ground node. Specifically, with reference to FIG. 2C, bottom plate 262 is connected to conductive via 273 that is, in turn, connected to source bus 244. Source bus 244 is connected to source through-silicon via (TSV) 246 that is, in turn, connected to ground plane 248 of transistor cell 200.

According to an embodiment, inductive coil 256 may have an inductance value in a range between about 20 pH to about 2 nH, and capacitor 260 may have a capacitance value in a range between about 1 pF to about 100 pF, although these components may have values outside of these ranges, as well. For example, at a fundamental frequency of operation of 2.0 GHz, which has a second harmonic at 4.0 GHz, inductive coil 256 may have an inductance value of about 140 pH, and capacitor 260 may have a capacitance value of about 11 pF.

Within transistor cell 200, when an input signal is applied to input bond pad 240 via a wirebond array (e.g., wirebond 298 of FIG. 2C) that is connected to input bond pad 240, the series-connected combination of inductor coil 256 and capacitor 260 may operate as an input-side harmonic termination circuit configured to shunt signal energy having a frequency corresponding to a harmonic of the fundamental operational frequency of the transistor cell 200 to ground (e.g., via a TSV 246). In that case, inductor coil 256 makes up the inductance of the harmonic termination circuit (e.g., inductor 152, FIG. 1), while capacitor 260 makes up the capacitance of the harmonic termination circuit (e.g., capacitor 154, FIG. 1). In this configuration with the input signal supplied to input bond pad 240, the circuit formed by the wirebond 298 supplying the input signal, and the combination of inductor coil 256 and capacitor 260 is configured in the same manner as input circuit 110 of FIG. 1, in which inductor 112 represents the wirebond 298 and is connected directly to node 172 via the connection represented by dashed line 199 (and the connection represented by dashed line 198 is not formed).

Referring again to FIG. 2A, drain metallizations 216 are coupled to drain buses 219 at the output side of active region 204 and transistor cell 200. A second bond pad, referred to herein as an output bond pad 242, is coupled to the drain buses 219 at the output side of active region 204. The output bond pad 242 is positioned outside of active region 204.

Source metallizations 220 are electrically coupled to source TSVs 246 through source metallization 244 and additional vias. The source TSVs 246 are formed within the active region 204 of transistor cell 200 and connect the source metallizations 220 to a ground node through via 276 and source metallization 244.

As best shown in FIG. 2C, the source TSVs 246 extend through base substrate 280 (i.e., between the top and bottom surfaces of the base substrate 280), and thus serve to electrically connect the source metallizations 220 to a common node (e.g., a ground plane 248) on a lower surface of the base substrate 280 of transistor cell 200. The source TSVs 246 may have a noncircular cross-section (e.g., oval or trench-shaped), as shown in FIGS. 2A and 2B, or may have a circular cross-section, in other embodiments.

Another passive component in the form of inductor coil 221 is formed within build-up structure 290 over substrate 202 between source metallizations 220 and between central TSV 246 and output bond pad 242. Specifically, inductor coil is formed within notch 254 defined by a patterned region of source metallizations 220 of transistor cell 200 and between gate structures 210. So patterned, source metallization 220 includes a pair of source forks 269 that comprises extended portions of source metallization 220 that form the sides of notch 251. Inductor coil 221 is formed within notch 254 allowing inductor coil 221 to be formed within build-up structure 290 over substrate 202 without contacting source metallizations 220. In embodiment, notch 254 may have a length 255 of about 400 micrometers and a width 250 of about 47 micrometers. In other embodiments, however the geometry of notch 254 can be adjusted such that notch 254 is appropriately sized to enable an inductor (e.g., inductor coil 221), a capacitor (e.g., capacitor 225), and/or other passive components to be formed over substrate 202 where the passive components are not in contact with the corresponding source metallization 220 or source metallization 244. For example, in an embodiment, notch 254 may have a length 255 that ranges from 300 micrometers to 500 micrometers and a width 250 that ranges from 45 micrometers to 55 micrometers.

In an embodiment, inductor coil 221 is configured as a loop of conductive material that may be formed in one of the multiple patterned conductive layers 292, 293, 294, 295 of build-up structure 290. As shown in FIG. 2C, in the depicted embodiment, inductor coil 221 is formed horizontally within patterned metal layer 294 of build-up structure 290. It should be understood, however, that in other embodiments, inductor coil 221 may be formed within any of the patterned conductive layers 292, 293, 294, 295 present within build-up structure 290. Additionally, although inductor coil 221 is depicted as being formed within a single patterned conductive layer, it should be understood that in other implementations parts or segments of inductor coil 221 could be formed in different ones of the patterned conductive layers 292, 293, 294, 295, in which case one or more vias may be utilized to connect the various parts or segments of the inductor coil 221.

Inductive coil 221 has a first terminal 222 that is on a perimeter of the coiled inductor coil 221 structure and a second terminal 223 that is at the interior of the coil inductor coil 221. Second terminal 223 at the center of inductor coil 221 is connected to source metallization 220 by a conductive extension 224 and may thereby be connected to a ground node. Extension 224 is formed in a patterned conductive layer (e.g., patterned conductive layer 295) of build-up structure 290.

Another passive component in the form of capacitor 225 is formed within build-up structure 290 over substrate 202 between source metallizations 220 and between central TSV 246 and output bond pad 242. Specifically, capacitor 225 is formed within notch 254 defined by a patterned region of source metallizations 220 of transistor cell 200 and between gate structures 210. Specifically, capacitor 225 is formed within a source region of transistor cell 200 in which the corresponding source metallization 220 has been patterned to include a notch or opening allowing capacitor 225 to be formed within build-up structure 290 without contacting source metallizations 220.

Capacitor 225 includes top plate 226 and bottom plate 227. Top plate 226 is separated from bottom plate 227 by a portion of the dielectric material of build-up structure 290. In an embodiment, top plate 226 is formed in patterned conductive layer 295 of build-up structure 290 and bottom plate 227 is formed in patterned conductive layer 292 though in various embodiments different portions of any of the patterned conductive layers of build up structure 290 may be used to form the top and bottom plate of capacitor 225. Bottom plate 227 of capacitor 225 is connected to terminal 222 of inductor coil 221. Top plate 226 of capacitor 225 is connected to output bond pad 242 by a conductive extension 228. Extension 228 is formed in a patterned conductive layer (e.g., patterned conductive layer 295) of build-up structure 290. Each of top plate 226 and bottom plate 227 of capacitor 225 may be formed in any of the conductive layers of build-up structure 290.

According to an embodiment, inductive coil 221 may have an inductance value in a range between about 20 pH to about 2 nH, and capacitance 225 may have a capacitance value in a range between about 1 pF to about 100 pF, although these components may have values outside of these ranges, as well. For example, at a fundamental frequency of operation of 2.0 GHz, which has a second harmonic at 4.0 GHz, inductive coil 221 may have an inductance value of about 140 pH, and capacitance 225 may have a capacitance value of about 11 pF.

Within transistor cell 200, when an output signal is generated at output bond pad 242, the series-connected combination of capacitor 225 and inductor coil 221 may operate as an output-side harmonic termination circuit configured to shunt signals having a frequency corresponding to a harmonic of an input frequency of an output signal of transistor cell 200 to ground (e.g., via a through-substrate via 246). In that case, inductor coil 221 makes up the inductance of the harmonic termination circuit (e.g., inductor 133, FIG. 1) that is connected between output bond pad 242 and a ground node, while capacitor 225 makes up the capacitance of the harmonic termination circuit (e.g., capacitor 135, FIG. 1). In other embodiments Although FIGS. 2A-2C depict an embodiment of transistor cell 200 in which the integrated passive components (inductor coils 256, 221 and capacitors 260, 225) are connected to one another and surrounding transistor cell 200 components in a particular network topology, it should be understand that in various embodiments of transistor cell 200, different configurations of passive components and their interconnections may be implemented. For example, in embodiments, the passive components may only be incorporated into transistor cell 200 at the input side (i.e., inductor coil 256 and capacitor 260) or the output side (i.e., inductor coil 221 and capacitor 225). It is not required that the passive components be incorporated into transistor cell 200 on both the input and output sides.

Additionally, the relative position of inductor coils 256, 221 and capacitors 260, 225 may be modified. In FIG. 2A, for example, the relative positions of inductor coil 256 and capacitor 260 could be reversed so that capacitor 260 is located between inductor coil 256 and input bond pad 240. Similarly, at the output side the relative positions of inductor coil 221 and capacitor 225 could be reversed so that inductor coil 221 is located between capacitor 225 and output bond pad 240.

In still other embodiments, the manner in which inductor coils 256, 221 and capacitors 260, 225 are electrically interconnected could be modified to enable inductor coils 256, 221 and capacitors 260, 225 to operate as components of different amplifier circuits, such as matching networks, harmonic termination components, attenuators, and the like. For example, in some embodiments, two sets of inductor coils and capacitors may be formed on the input side of transistor cell 200 within notch 251, where a first inductor coil and capacitor pair may be connected together in an input harmonic termination configuration and a second inductor coil and capacitor pair may be connected together in an impedance matching configuration. Similarly, multiple capacitor and inductor coils may be formed on the output side of transistor cell 200 within notch 254, in the manner described herein.

In still other embodiments, the passive components on the input side of transistor cell 200 within notch 251 may include two inductive coils and a single capacitor in which the first inductive coil is connected in series to the capacitor between an input to transistor cell 200 and a ground node and the second inductive coil is connected in series with an input wirebond to the transistor cell and the second inductive coil is also connected to the capacitor where the capacitor is in a shunt configuration. A similar arrangement of passive components may be formed on the output side of transistor 200 within notch 254.

In some types of transistor the lengths of the respective gate structures 210, drain metallizations 216, and source metallizations 220 may be sufficiently long that applicable design rules promote the formation of multiple (e.g., two or more) TSVs 246 along the lengths of the source metallizations 220. In that case, embodiments of the present invention may be implemented in which regions of source metallizations 220 between such two or more TSVs 246 are etched to form notches (e.g., having dimensions similar to those of notch 251 and notch 2540. Passive components as described in the present disclosure (such as combinations of capacitors 225 and/or 260 and inductor coils 221 and/or 256) can then be formed within the notches and interconnected to other transistor components as described herein.

For example, in a specific alternate embodiment, an input signal to transistor die 200 can be supplied by a wirebond array (e.g., wirebond 299, FIG. 2C) connected to top plate 261 of capacitor 260. In this configuration, the wirebond 299, in combination with capacitor 260 and inductor coil 256 form an input impedance network having a T-match topology or configuration. In this configuration, the impedance matching circuit formed by wirebond array 299, inductor coil 256, and capacitor 260 is configured in the same manner as input circuit 110 of FIG. 1, in which inductor 112 represents the wirebond 299, which is connected directly to node 171 via dashed line 198.

In this configuration, wirebond 299 forms a first inductive element of the impedance matching network (e.g., inductor 112, FIG. 1) and is connected in series to terminal 257 of inductor coil 256, which forms a second inductive element of the matching network (e.g., inductor 116, FIG. 1). Additionally, in this configuration, capacitor 260 forms the capacitive element of the matching network (e.g., capacitor 114, FIG. 1). A first terminal of capacitor 260 (i.e., top plate 261) is connected to the node made up of conductive trace 275 (e.g., node 113, FIG. 1) between wirebond 299 and inductor coil 256. The second terminal of capacitor 260 (i.e., bottom plate 262) is connected to ground.

In still other embodiments only an inductive element or a capacitive element may be incorporated into the transistor cell 200 within the notches 251, 254 on either the input side or the output side. In embodiments in which only an inductive element is incorporated into the substrate of transistor cell 200 on the input side and/or the output side, a discrete capacitor component can be electrically connected to the integrated inductive element to provide desired impedance match or harmonic termination characteristics on the input side and/or the output side of the transistor cell 200. Conversely, in embodiments in which only a capacitive element is incorporated into the substrate of transistor cell 200 on the input side and/or the output side, a discrete inductive component can be electrically connected to the integrated inductive element to provide desired impedance match or harmonic termination characteristics on the input side and/or the output side of the transistor cell 200.

Figure 3:
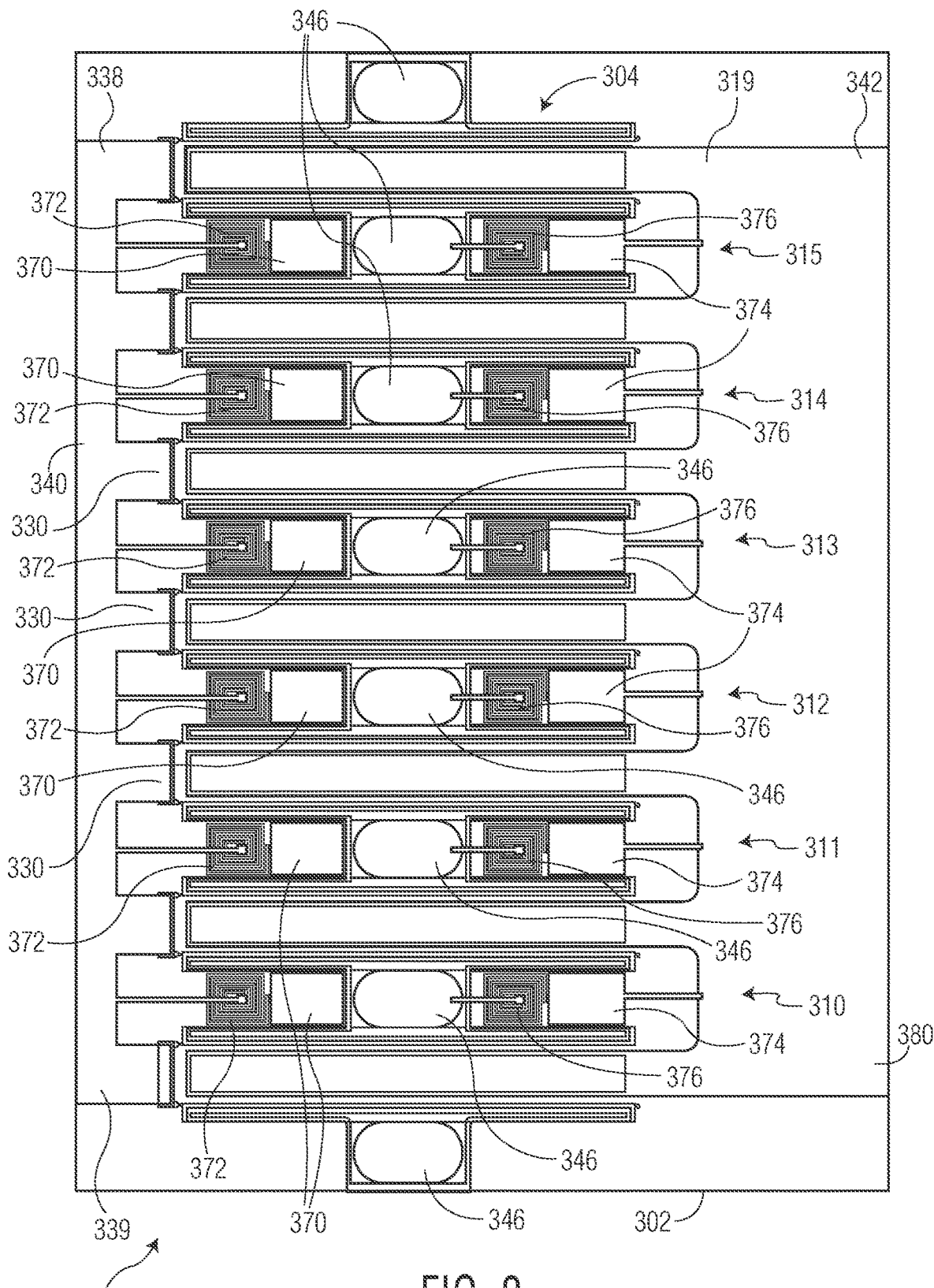
FIG. 3 shows a top view of a field effect transistor that includes a number, N, of instances of the transistor cell of FIGS. 2A-2C.

In order to build a power transistor of a desired power capability, multiple instances of transistor cell 200 may be replicated in parallel and interconnected with common input and output bond pads. For example, FIG. 3 shows a top view of a FET 300 that includes a number, N, of instances of the transistor cell 200 of FIGS. 2A-2C. More particularly, FET 300 includes FET cells 310, 311, 312, 313, 314, 315 (i.e., N=6) integrally formed within a single semiconductor substrate 302. Those of skill in the art would understand, based on the description herein, that the number, N, of FET cells included within a device may be greater or less than 6 (e.g., $1 \leq N \leq 20$ or more, in various embodiments), depending on the desired periphery and power capability of the FET 300.

As previously discussed, semiconductor substrate 302 may include a base semiconductor substrate (e.g., base semiconductor substrate 280, FIG. 2C) and a build-up structure (e.g., build-up structure 290, FIG. 2C) coupled to the top surface of the base semiconductor substrate. The base semiconductor substrate may be formed, for example, from bulk or composite semiconductor materials (e.g., Si, GaN, GaAs, SoI, GaN-on-insulator, SiGe, or other suitable materials). The build-up structure includes multiple dielectric layers that separate multiple patterned conductive layers, along with conductive vias that electrically connect portions of the conductive layers. The various details and embodiments associated with substrate 202 (FIGS. 2A-2C), discussed above, apply also to the substrate 302 of FIG. 3, and accordingly those details and embodiments are intended to apply also to FET 300.

Each of the FET cells 310-315 includes an active region (e.g., active region 204, FIG. 2A) formed in the substrate 302. A combination of the active regions for all FET cells 310-315 is referred to as a cumulative active region 304. Cumulative active region 304 includes all of the sets of interdigitated input gate structures (e.g., gate structures 210, FIGS. 2A, 2B), output drain metallizations (e.g., drain metallizations 216, FIGS. 2A, 2B), and common source metallizations (e.g., source metallizations 220, FIGS. 2A, 2B) for all of the FET cells 310-315, and the gate structures, drain metallizations, and source metallizations all are oriented substantially parallel to one another.

Drain metallizations for all of the FET cells 310-315 are coupled together by a drain bus 319 at the output side of FET 300. An output bond pad 342 is coupled to the drain bus 319 at an output side of active region 304. As shown in FIG. 3, the drain bus 319 and the output bond pad 342 are elongated conductive structures that extend across the combined width of all of the FET cells 310-315.

Additionally, the source metallizations for each of the FET cells 310-315 are coupled to one another via source metallization, and the source metallization, in turn, is coupled to source TSVs 346 within active region 304.

According to an embodiment, the gate structures (e.g., gate structures 210, FIGS. 2A, 2B) for each FET cell 310-315 are coupled together by one or more gate busses 330 associated with each FET cell 310-315. An input bond pad 340, is coupled to all of the gate busses 330 at an input side of active region 304. As shown in FIG. 3, the input bond pad 340 is an elongated conductive structure that extends across the combined width of all of the FET cells 310-315. More specifically, the input bond pad 340 is formed in the semiconductor substrate 302 and spaced apart from the active region 304, and the input bond pad 340 is physically and electrically continuous between first and second ends 338, 339 of the input bond pad 340.

As described above in conjunction with FIGS. 2A-2C, each one of FET cells 310-315 includes one or more passive components incorporated into the input side and/or output side of the active area of each FET cell 310-315. Specifically, on the input sides of each FET cell 310-315 input-side capacitors 370 (e.g., capacitor 260, FIGS. 2A-2C) and inductive coils 372 (e.g., inductive coils 256, FIGS. 2A-2C) are formed within semiconductor substrate 302 within notches (e.g., notch 251 or notch 254 of FIG. 2A-2C) of the source metallization of FET 300. Each one of FET cells 310-315 includes at least one of capacitors 370 and one of inductive coils 372 wherein each capacitor 370 and inductive coil 372 pair may be electrically connected to one another. As described in conjunction with FIGS. 2A-2C for each FET cell 310-315, the combination of a capacitor 370 and an inductive coil 372 may be electrically connected to form part of impedance matching and/or harmonic termination networks formed within or coupled to the input of FET 300.

In embodiments in which an input signal is supplied to FET 300 via a wirebond array connected to input bond pad 340, the series-connected combinations of capacitors 370 and inductor coils 372 can operate as a portion of an input-side harmonic termination circuits (e.g., each configured in the same manner as input circuit 110 of FIG. 1 in its configuration as a harmonic termination circuit). In that case, inductor coils 372 of each pair of passive components makes up the inductance of the harmonic termination circuit (e.g., inductor 116), while the capacitor 370 of each pair makes up the capacitance of the harmonic termination circuit (e.g., capacitor 114).

In another embodiment, an input signal may be supplied to FET 300 through an array of wirebonds that are connected to the top plates of capacitors 370 rather than input bond pad 340. In such an embodiment, the top plates of capacitors 370 may have a surface area that is sufficiently large to enable wirebond attachment. For example, in some embodiment, the top plates of such capacitor 370 may have a surface area of at least 67 micrometers square, though in other embodiments, the top plates may have other surface areas (larger or smaller) as require to enable appropriate attachment of wirebonds. In this configuration, the array of wirebonds carrying the input signal, in combination with capacitor 370 and inductor coil 372 pairs form an input impedance network having a T-match configuration. Specifically, in that configuration one of more of the wirebond bonds in the input wirebond array forms a first inductive element of the matching network (e.g., inductor 112, FIG. 1) and is connected in series to inductor coils 372, which form second inductive elements of the matching network (e.g., inductor 116, FIG. 1). Additionally, in this configuration, each capacitor 370 forms capacitive elements of the matching network (e.g., capacitor 114, FIG. 1). A first terminal of each capacitor 370 (i.e., each capacitor 370's top plate) is connected to the node between the input wirebond array and each inductive coil 372. The second terminal of each capacitor 370 (i.e., each capacitor 370's bottom plate) is connected to ground.

When an input signal is supplied to FET 300 via wirebonds connected to the top plates of capacitors 370, it should be understood that the size of input bond pad 340 can be significantly reduced as it no longer requires sufficient size to receive wirebond connections. For example, the size of input bond pad 340 can be reduced to a minimum size that allows input bond pad 340 to form electrical interconnections between gate structures 210.

On the output sides of each FET cell 310-315 output-side capacitors 374 (e.g., capacitor 225, FIGS. 2A-2C) and inductive coils 376 (e.g., inductive coils 221, FIGS. 2A-2C) are present within active region 304 of FET 300. Each one of FET cells 310-315 includes at least one of capacitors 374 and one of inductive coils 376 wherein each capacitor 374 and inductive coil 376 pair are connected to one another in series. As described in conjunction with FIGS. 2A-2C for each FET cell 310-315, the combination of capacitor 374 and inductive coil 376 may form part of harmonic termination networks formed within or coupled to the output of FET 300. The top plate of each capacitor 374 is connected to output bond pad 342 by a conductive extension. The bottom plate of each capacitor 374 is connected to a first terminal of each respective inductive coil 376 and a second terminal of each respective inductive coil 376 is connected to a ground node via a TSV 346.

In this configuration, when an output signal is generated at output bond pad 342, the series-connected pairs of capacitors 374 and inductive coils 376 may operate as an output-side harmonic termination circuit. In that case, inductive coils 376 makes up the inductance of the harmonic termination circuit (e.g., inductor 133, FIG. 1), while capacitors 374 make up the capacitance of the harmonic termination circuit (e.g., capacitor 135, FIG. 1).

Figure 4:
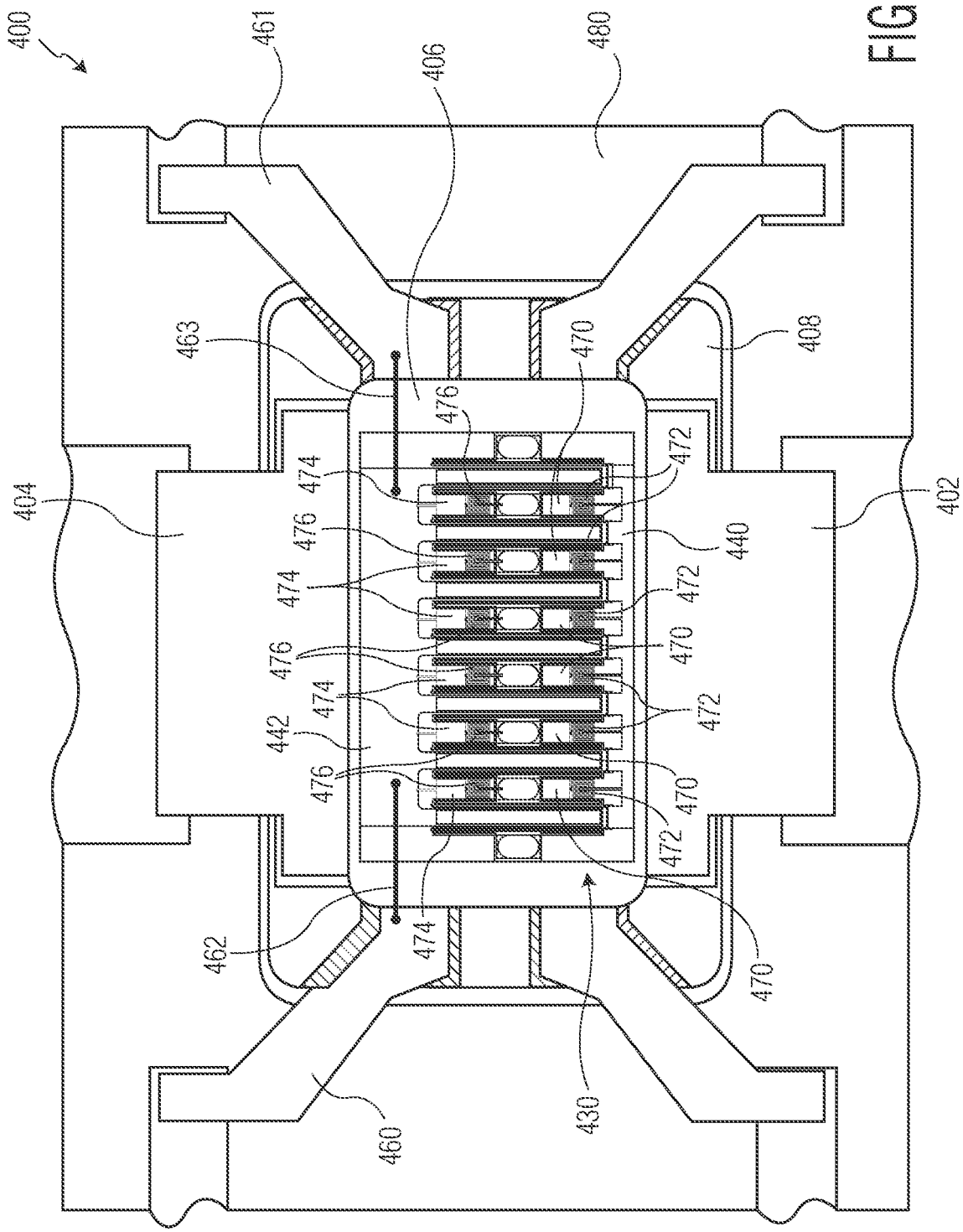
FIG. 4 is a top view of an embodiment of a packaged RF amplifier device that embodies an instance of the circuit of FIG. 1 and the transistor of FIG. 3.

Embodiments of FET 300 may be incorporated into power amplifiers or other circuitry. For example, FIG. 4 is a top view of an embodiment of a packaged RF amplifier device 400 that embodies an instance of circuit 100 of FIG. 1 and FET 300 of FIG. 3, and which may be utilized to provide an amplification device in an RF amplifier system. The packaged RF amplifier device 600 is configured to be surface mounted to a PCB or other system substrate. More specifically, the below-described package leads 402, 404 are configured to be soldered or otherwise conductively attached to corresponding conductive traces on a PCB or other system substrate, and those conductive traces are, in turn, electrically connected to other portions of the amplifier.

Although device 400 is depicted and described herein as being housed in a high-power device package, those of skill in the art would understand, based on the description herein, that device 400 may be housed in other types of surface-mount device packages as well, including for example, flat no-leads packages (e.g., quad flat no-leads (QFN) or dual flat no-leads (DFN) packages), in which the package leads 402, 404 are instead implemented as perimeter lands that are exposed on the bottom surface of the package.

Device 400 includes a flange 406 (or "device substrate"), in an embodiment, which includes a rigid electrically-conductive substrate with a thickness that is sufficient to provide structural support for various electrical components and elements of device 400. In addition, flange 406 may function as a heat sink for die 430 and other devices mounted on flange 406. Flange 406 has top and bottom surfaces (only a central portion of the top surface is visible in FIG. 4), and may have a substantially-rectangular perimeter that corresponds to the perimeter of the device 400.

Flange 406 is formed from an electrically conductive material, and may be used to provide a ground reference node for the device 400. For example, various components and elements may have terminals that are electrically coupled to flange 406, and flange 406 may be electrically coupled to a system ground when the device 400 is incorporated into a larger electrical system. At least the top surface of flange 406 is formed from a layer of conductive material, and possibly all of flange 406 is formed from bulk conductive material.

An isolation structure 408 is attached to the top surface of flange 406, in an embodiment. Isolation structure 408, which is formed from a rigid, electrically insulating material, provides electrical isolation between conductive features of the device (e.g., between leads 402, 404 and flange 406). Isolation structure 408 has a frame shape, in an embodiment, which includes a substantially enclosed, four-sided structure with a central opening. Isolation structure 408 may have a substantially rectangular shape, as shown in FIG. 4, or isolation structure 408 may have another shape (e.g., annular ring, oval, and so on).

A portion of the top surface of flange 406 that is exposed through the opening in isolation structure 408 is referred to herein as the "active area" of device 400. Transistor die 430 is positioned within the active device area of device 400. Transistor die 430 may be coupled to the top surface of flange 406 using conductive epoxy, solder, solder bumps, sintering, and/or eutectic bonds.

Device 400 houses an amplification path that represents a physical implementation of RF power amplifier circuit 100 of FIG. 1. The amplification path includes input lead 402 (e.g., input 102, FIG. 1), output lead 404 (e.g., output 104, FIG. 1), and transistor die 430.

Input and output leads 402, 404 are mounted on a top surface of the isolation structure 408 on opposed sides of the central opening, and thus the input and output leads 402, 404 are elevated above the top surface of the flange 406, and are electrically isolated from the flange 406. Generally, the input and output leads 402, 404 are oriented to allow for attachment of bondwires between the input and output leads 402, 404 and components and elements within the central opening of isolation structure 408.

Transistor die 430 includes an integrated power FET, where the FET may be configured in the same manner as FET 300 of FIG. 3. The FET of transistor die 430 has a control terminal (e.g., a gate) and two current conducting terminals (e.g., a drain terminal and a source terminal). A control terminal of the FET within transistor die 430 is coupled through an input circuit (e.g., input circuit 110, FIG. 1) and input bond pad 440 to an input lead 402 of device 400. In addition, one current conducting terminal (e.g., the drain) of the FET within transistor die 430 is coupled to output lead 404 through an output circuit (e.g., output circuit 140, FIG. 1) and output bond pad 442 of transistor die 430. The other current conducting terminal (e.g., the source) of the FET within transistor die 430 is electrically coupled through the die 430 to flange 406 (e.g., to ground), in an embodiment.

A number of passive components are formed within the substrate of transistor die 430. Specifically, inductor-capacitor pairs are formed on each of an input and an output side of transistor die 430. On the input side, transistor die 430 includes a number of integrated capacitors 470 (e.g., capacitors 370, FIG. 3, capacitors 260, FIGS. 2A-2C) and integrated inductive coils 472 (e.g., inductive coils 372, FIG. 3, inductive coils 256, FIGS. 2A-2C). Although FIG. 4 depicts combinations of capacitors 470 and inductive coils 472 on the input side, it is contemplated that in embodiments device 400, the input side may include only capacitors 470 or inductive coils 472. A top plate of each capacitor 470 is coupled to a first terminal of each corresponding inductive coil 472 and the bottom plate of each integrated capacitors 470 is connected to a ground node. The second terminal of each inductive coil 472 is connected to bond pad 440. In various alternate embodiments contemplated herein, As described herein, capacitors 470 and inductive coils 472 may form part of an input impedance matching network or a harmonic control circuit on the input side of the FET of transistor die 430. When an input signal is supplied via a wirebond array coupled between input lead 402 and bond pad 440, each pair of capacitors 470 and inductive coils 472 operates as an input harmonic termination circuit in which the capacitors 470 operate as the capacitive element (e.g., capacitor 114, FIG. 1) of the harmonic termination circuit and the inductive coils 472 operate as the inductive element (e.g., inductor 116, FIG. 1) of the harmonic termination circuit. This configuration is reflected in the configuration of FIG. 1 in which inductor 112 represents the wirebond coupled between input lead 402 and bond pad 440 and the inductor 112 is connected to node 172.

Conversely, when an input signal is supplied via a wirebond array coupled between input lead 402 and the top plates of capacitors 470, each pair of capacitors 470 and inductive coils 472 operates as an input impedance matching circuit in which the capacitors 470 operate as the capacitive element (e.g., capacitor 114, FIG. 1) of the impedance matching circuit and the inductive coils 472 operate as the inductive element (e.g., inductor 116, FIG. 1) of the impedance matching circuit. This configuration is reflected in the configuration of FIG. 1 in which inductor 112 represents the wirebonds coupled between input lead 402 and the top plate of capacitors 470 at node 171.

On the output side, transistor die 430 includes a number of integrated capacitors 474 (e.g., capacitors 374, FIG. 3, capacitors 260, FIGS. 2A-2C) and integrated inductive coils 476 (e.g., inductive coils 376, FIG. 3, inductive coils 221, FIGS. 2A-2C). As described in conjunction with FIGS. 2A-2C for each FET cell 310-315, the pairs of capacitors 474 and inductive coils 476 may form part of harmonic termination networks formed within or coupled to the output of the FET of transistor die 400. The top plate of each capacitor 474 is connected to output bond pad 442 by a conductive extension. The bottom plate of each capacitor 474 is connected to a first terminal of each respective inductive coil 476 and a second terminal of each respective inductive coil 476 is connected to a ground node.

In this configuration, when an output signal is generated at output bond pad 442, the series-connected pairs of capacitors 474 and inductive coils 476 may operate as an output-side harmonic termination circuit. In that case, inductive coils 476 makes up the inductance of the harmonic termination circuit (e.g., inductor 133, FIG. 1), while capacitors 474 make up the capacitance of the harmonic termination circuit (e.g., capacitor 135, FIG. 1).

As discussed previously, the FET of transistor die 430 may include a III-V field effect transistor (e.g., a HEMT), such as a GaN FET (or another type of III-V transistor, including a GaAs FET, a GaP FET, an InP FET, or an InSb FET). More specifically, the transistor die 430 may include an integral base semiconductor substrate (e.g., a GaN substrate, a GaN-on-silicon substrate, a GaN-on-silicon carbide substrate, and so on). Conductive connections between the first current-conducting terminal of the transistor die 430 (e.g., the drain terminal) and the output terminal 432 of the transistor die 430 may be made through a build-up structure (not shown) of alternating dielectric and patterned conductive layers, where portions of the patterned conductive layers are electrically connected using conductive vias. The second current-conducting terminal (e.g., the source terminal) may be electrically connected to the conductive flange 406 using through-substrate vias or doped sinker regions (not shown) to a conductive layer on a bottom surface of the transistor die 430.

In the embodiment depicted in FIG. 4, transistor die 430 depicts a single-stage amplifier in which a single FET provides for signal amplification. In other embodiments, die 430 may include a two-stage amplifier, which includes a pre-amplifier FET coupled in series with a final-stage FET. In such an embodiment, the input bond pad 440 of the die 430 would be electrically connected to the control terminal (e.g., gate terminal) of the pre-amplifier FET, and a current-conducting terminal (e.g., drain terminal) of the pre-amplifier FET would be electrically connected to the control terminal (e.g., gate terminal) of the final-stage FET. A current-conducting terminal (e.g., drain terminal) of the final-stage FET would be electrically connected to the output bond pad 442 of the die 430.

Referring again to FIG. 4, in addition to the input and output leads 402, 404, device 400 also may include input-side bias leads (not numbered) and output-side bias leads 460, 461. The input-side bias leads may be electrically coupled through bondwires (not shown) and other conductors to the control terminal of the FET within transistor die 430. Conversely, the output-side bias leads 460, 461 can be electrically coupled through bondwires 462 and 463 to the first current conducting terminal (e.g., the drain terminal) of the final-stage FET within transistor die 430.

The bias leads 460, 461 may be electrically coupled through traces on substrate 480 to external bias circuit(s) (not shown), which provide drain bias voltages to the current conducting terminal (e.g., drain terminal) of each FET through the bias leads 460, 461. In other embodiments, the output-side bias leads 460, 461 and bondwires 462, 463 may be excluded, and the drain bias voltages may be provided instead through leads 404.

According to an embodiment, device 400 is incorporated in an air cavity package, in which transistor die 430, and various other components are located within an enclosed air cavity. Basically, the air cavity is bounded by flange 406, isolation structure 408, and a cap (not shown) overlying and in contact with the isolation structure 408 and leads 402, 404. In other embodiments, the components of device 400 may be incorporated into an overmolded package (i.e., a package in which the electrical components within the active device area are encapsulated with a non-conductive molding compound, and in which portions of the leads 402, 404 also may be encompassed by the molding compound). In an overmolded package, isolation structure 408 may be excluded. In still other embodiments, as discussed previously, transistor die 430, and various other components may be housed in a different type of package altogether, such as a QFN, DFN, or other type of surface mount package. In such other embodiments, leads 402, 404 may be replaced perimeter lands that are exposed on the bottom surface of the package, but are electrically isolated from the flange 406.

Further, although embodiments have been described herein with respect to an RF power amplifier, those of skill in the art would understand, based on the description herein, that embodiments of the inventive subject matter may be used in conjunction with virtually any type of single- or multiple-path amplifier. Accordingly, the transistor embodiments with integrated passive components described herein may be utilized in conjunction with various amplification systems including RF Doherty amplifiers. The present transistor embodiments may be implemented within a wide variety of circuits.

In some aspects, the present disclosure provides a device including a semiconductor substrate, a source metallization over an active area of the semiconductor substrate, a through-substrate via electrically connected to the source metallization, and an input bond pad formed in the semiconductor substrate and spaced apart from the active area. The input bond pad is electrically connected to a set of gate structures. The transistor includes a first inductive coil over the semiconductor substrate between a first portion of the source metallization and a second portion of the source metallization and a first capacitor over the semiconductor substrate between the first portion of the source metallization and the second portion of the source metallization. The first inductive coil and the first capacitor are connected in series between the input bond pad and the through-substrate via.

In some aspects, the present disclosure provides the device further includes a set of drain metallizations in the active area of the semiconductor substrate, and an output bond pad formed in the semiconductor substrate and spaced apart from the active area. The output bond pad is electrically connected to the set of drain metallizations. The device includes a second capacitor over the semiconductor substrate between a third portion of the source metallization and a fourth portion of the source metallization, wherein a first terminal of the second capacitor is electrically connected to the output bond pad. The device includes a second inductive coil over the semiconductor substrate between the third portion of the source metallization and the fourth portion of the source metallization. A first terminal of the second inductive coil is electrically connected to a second terminal of the second capacitor and a second terminal of the second inductive coil is connected to a ground node.

In some aspects, present disclosure provides a device including a semiconductor substrate, a source metallization formed over the semiconductor substrate, a through-substrate via electrically connected to the source metallization, and an input bond pad formed in the semiconductor substrate and spaced apart from the active region. The input bond pad being electrically connected to a set of gate structures. The device includes a first passive component over the semiconductor substrate between a first portion of the source metallization and a second portion of the source metallization. A first terminal of the first passive component is electrically connected to the input bond pad to form part of an input circuit. The first passive component includes at least one of a first capacitor and a first inductor.

In some aspects, the present disclosure provides a radio frequency power amplifier, including a packaged amplifier device including a flange, an input lead, an output lead, and an amplifier die coupled to the flange. The amplifier die includes a semiconductor substrate, source metallizations in an active region of the semiconductor substrate, and an input bond pad formed on the semiconductor substrate and spaced apart from the active region. The input bond pad is electrically connected to a plurality of gate structures. The die includes a first inductive coil over the substrate between a first source metallization in the set of source metallizations and a second source metallization in the set of source metallizations. A first terminal of the first inductive coil is electrically connected to the input bond pad. The die includes a first capacitor over the substrate between the first source metallization and the second source metallization, wherein a first terminal of the first capacitor is electrically connected to a second terminal of the first inductive coil and a second terminal of the first capacitor is electrically connected to a through-substrate via. The radio frequency power amplifier includes a first wirebond electrically connecting the input lead to the first terminal of the first capacitor.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A device, comprising:
a semiconductor substrate;
a source metallization over an active area of the semiconductor substrate;
a through-substrate via electrically connected to the source metallization;
an input bond pad formed in the semiconductor substrate and spaced apart from the active area, the input bond pad being electrically connected to a set of gate structures;
a first inductive coil over the semiconductor substrate between a first portion of the source metallization and a second portion of the source metallization; and
a first capacitor over the semiconductor substrate between the first portion of the source metallization and the second portion of the source metallization, wherein the first inductive coil and the first capacitor are connected in series between the input bond pad and the through-substrate via.

2. The device of claim 1, wherein the first inductive coil and the first capacitor are not electrically connected to the source metallization.

3. The device of claim 1, wherein the first inductive coil and the first capacitor are between the through-substrate via and the input bond pad.

4. The device of claim 3, wherein the first inductive coil and the first capacitor are part of an input circuit electrically connected to the input bond pad.

5. The device of claim 1, wherein, the first inductive coil and the first capacitor are configured to shunt signal energy having a frequency corresponding to a harmonic of a fundamental operational frequency of an input signal to the transistor to the through-substrate via.

6. The device of claim 1, wherein the first inductive coil and the first capacitor form a portion of an input impedance matching network.

7. The device of claim 1, further comprising:
a set of drain metallizations in the active area of the semiconductor substrate;
an output bond pad formed in the semiconductor substrate and spaced apart from the active area, the output bond pad being electrically connected to the set of drain metallizations;
a second capacitor over the semiconductor substrate between a third portion of the source metallization and a fourth portion of the source metallization, wherein a first terminal of the second capacitor is electrically connected to the output bond pad; and
a second inductive coil over the semiconductor substrate between the third portion of the source metallization and the fourth portion of the source metallization, wherein a first terminal of the second inductive coil is electrically connected to a second terminal of the second capacitor and a second terminal of the second inductive coil is connected to a ground node.

8. The device of claim 7, wherein the second capacitor and the second inductive coil are configured to shunt signal energy having a frequency corresponding to a harmonic of a fundamental operational frequency of an input signal to the transistor to the through-substrate via.

9. The device of claim 1, wherein the source metallization is patterned to include a notch having a length that ranges from 300 micrometers to 500 micrometers and a width that ranges from 45 micrometers to 55 micrometers and the first inductive coil and the first capacitor are formed within the notch of the source metallization.

10. A device, comprising:
a semiconductor substrate;
a source metallization formed over the semiconductor substrate;
a through-substrate via electrically connected to the source metallization;
an input bond pad formed in the semiconductor substrate and spaced apart from the active region, the input bond pad being electrically connected to a set of gate structures; and
a first passive component over the semiconductor substrate between a first portion of the source metallization and a second portion of the source metallization, wherein a first terminal of the first passive component is electrically connected to the input bond pad to form part of an input circuit, wherein the first passive component includes at least one of a first capacitor and a first inductor.

11. The device of claim 10, wherein the first passive component is between the input bond pad and the through-substrate via.

12. The device of claim 10, wherein the first passive component is part of a harmonic termination circuit.

13. The device of claim 10, further comprising:
an output bond pad formed in the semiconductor substrate and spaced apart from the active region, the output bond pad being electrically connected to a set of drain metallizations in the active region of the semiconductor substrate;
a second passive component over the semiconductor substrate between the first portion of the source metallization and the second portion of the source metallization, wherein a first terminal of the second passive component is electrically connected to the output bond pad, and the second passive component includes at least one of a second capacitor and a second inductor selected to be different from the first passive component.

14. A radio frequency power amplifier, comprising:
a packaged amplifier device, including:

a flange,
an input lead,
an output lead, and
an amplifier die coupled to the flange, wherein the amplifier die includes:
  a semiconductor substrate,
  source metallizations in an active region of the semiconductor substrate,
  an input bond pad formed on the semiconductor substrate and spaced apart from the active region, the input bond pad being electrically connected to a plurality of gate structures,
  a first inductive coil over the substrate between a first source metallization in the set of source metallizations and a second source metallization in the set of source metallizations, wherein a first terminal of the first inductive coil is electrically connected to the input bond pad, and
  a first capacitor over the substrate between the first source metallization and the second source metallization, wherein a first terminal of the first capacitor is electrically connected to a second terminal of the first inductive coil and a second terminal of the first capacitor is electrically connected to a through-substrate via; and
  a first wirebond electrically connecting the input lead to the first terminal of the first capacitor.

15. The radio frequency power amplifier of claim 14, wherein the first inductive coil and the first capacitor operate as a first harmonic termination circuit to shunt signal energy having a frequency corresponding to a harmonic of a fundamental operational frequency of an input signal to the transistor to the through-substrate via.

16. The radio frequency power amplifier of claim 14, wherein the amplifier die further comprises:
  an output bond pad formed in the semiconductor substrate and spaced apart from the active region, the output bond pad being electrically connected to a set of drain metallizations in the active region of the semiconductor substrate;
  a second capacitor over the semiconductor substrate between the first source metallization and the second source metallization, wherein a first terminal of the second capacitor is electrically connected to the output bond pad; and
  a second inductive coil over the semiconductor substrate between the first source metallization and the second source metallization, wherein a first terminal of the second inductive coil is electrically connected to a second terminal of the second capacitor and a second terminal of the second inductive coils is connected to a ground node.

17. The radio frequency power amplifier of claim 16, wherein the second capacitor and the second inductive coil operate as a second harmonic termination circuit to shunt signal energy having a frequency corresponding to a harmonic of a fundamental operational frequency of an input signal to the transistor to the through-substrate via.

18. The radio frequency power amplifier of claim 14, wherein a third source metallization in the set of source metallizations patterned to include a first notch and the first inductive coil and the first capacitor are formed within the first notch.

19. The radio frequency power amplifier of claim 18, wherein the first notch a length that ranges from 300 micrometers to 500 micrometers and a width that ranges from 45 micrometers to 55 micrometers.

20. The radio frequency power amplifier of claim 18, wherein the third source metallization is patterned to include a second notch and the second inductive coil and the second capacitor are formed within the second notch.

* * * * *